United States Patent [19]

Fruhauf et al.

[11] Patent Number: 4,860,258

[45] Date of Patent: Aug. 22, 1989

[54] ELECTRICALLY PROGRAMMABLE NON-VOLATILE MEMORY HAVING SEQUENTIALLY DEACTIVATED WRITE CIRCUITS

[75] Inventors: Serge Fruhauf, Peynier; Alexis Marquot, St Maximin, both of France

[73] Assignee: Thomson Semiconducteurs, Paris, France

[21] Appl. No.: 110,274

[22] Filed: Oct. 20, 1987

[30] Foreign Application Priority Data

Oct. 20, 1986 [FR] France ............... 86 14523

[51] Int. Cl.[4] ............................................... G11C 7/00
[52] U.S. Cl. ...................... 365/194; 365/189; 365/226; 365/185; 365/240; 365/189.08
[58] Field of Search ............ 365/104, 184, 185, 194, 365/195, 226, 228, 239, 240; 377/67, 73, 76, 79, 81

[56] References Cited

U.S. PATENT DOCUMENTS

| | | | |
|---|---|---|---|
| 4,441,198 | 4/1984 | Shibata et al. | 377/81 |
| 4,453,208 | 6/1984 | Middleton et al. | 365/228 |
| 4,644,250 | 2/1987 | Hartgring | 365/226 |
| 4,710,900 | 12/1987 | Higuchi | 365/185 |

FOREIGN PATENT DOCUMENTS

59-101095  6/1984  Japan ..................... 365/194

Primary Examiner—Stuart N. Hecker
Assistant Examiner—Glenn A. Gossage
Attorney, Agent, or Firm—Oblon, Spivak, McClelland, Maier & Neustadt

[57] ABSTRACT

An electrically programmable non-volatile memory includes a matrix of memory cells accessible by rows and columns, write and read circuits which apply potentials, representing the programmed datum or representing the read command, to the rows and columns. The memory also includes a device which controls the interconnection of the write and read circuits with the memory cells, wherein N memory cells are programmed simultaneously, N being greater than 1, each memory cell setting up a current surge when it is programmed at "1". The memory also includes a device for deactivating, one by one, the write circuits corresponding to the N memory cells where there is a change-over from a programming mode to a read mode, and a structure to short-circuit the deactivation device at the change-over to the programming mode.

7 Claims, 4 Drawing Sheets

FIG_1 PRIOR ART
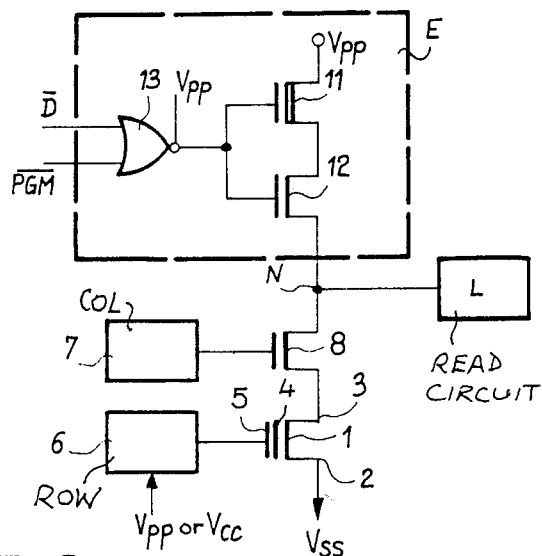
FIG_3
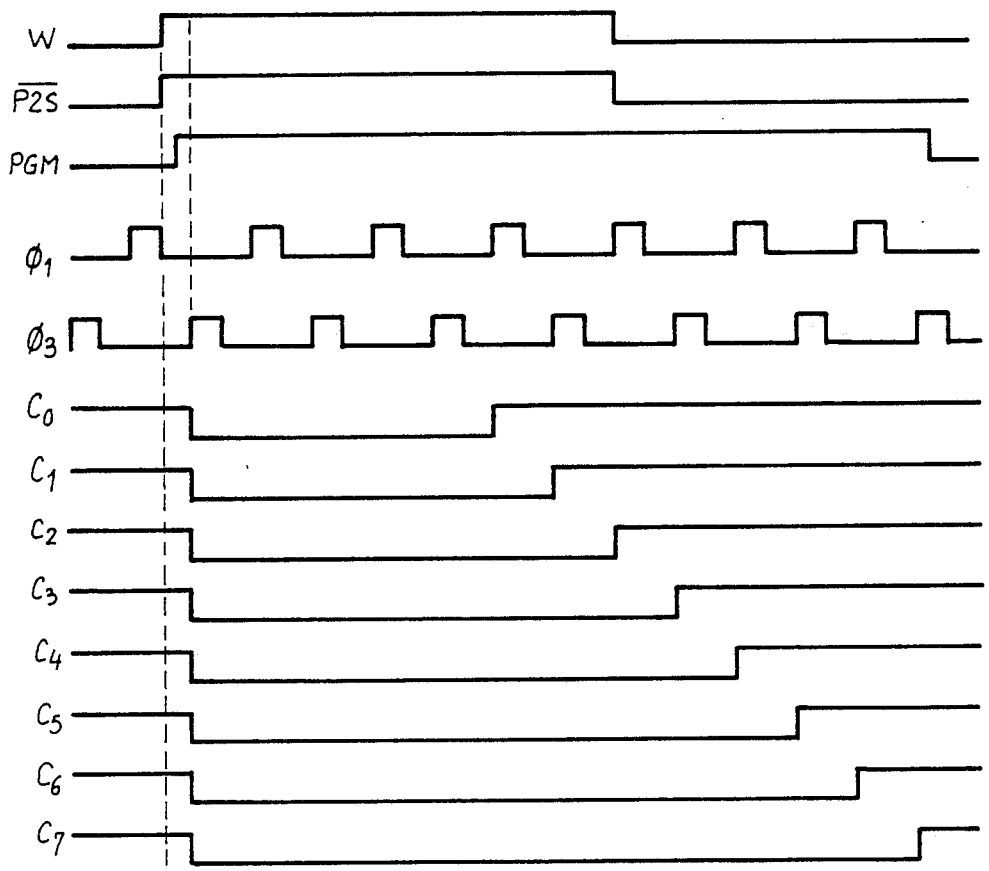

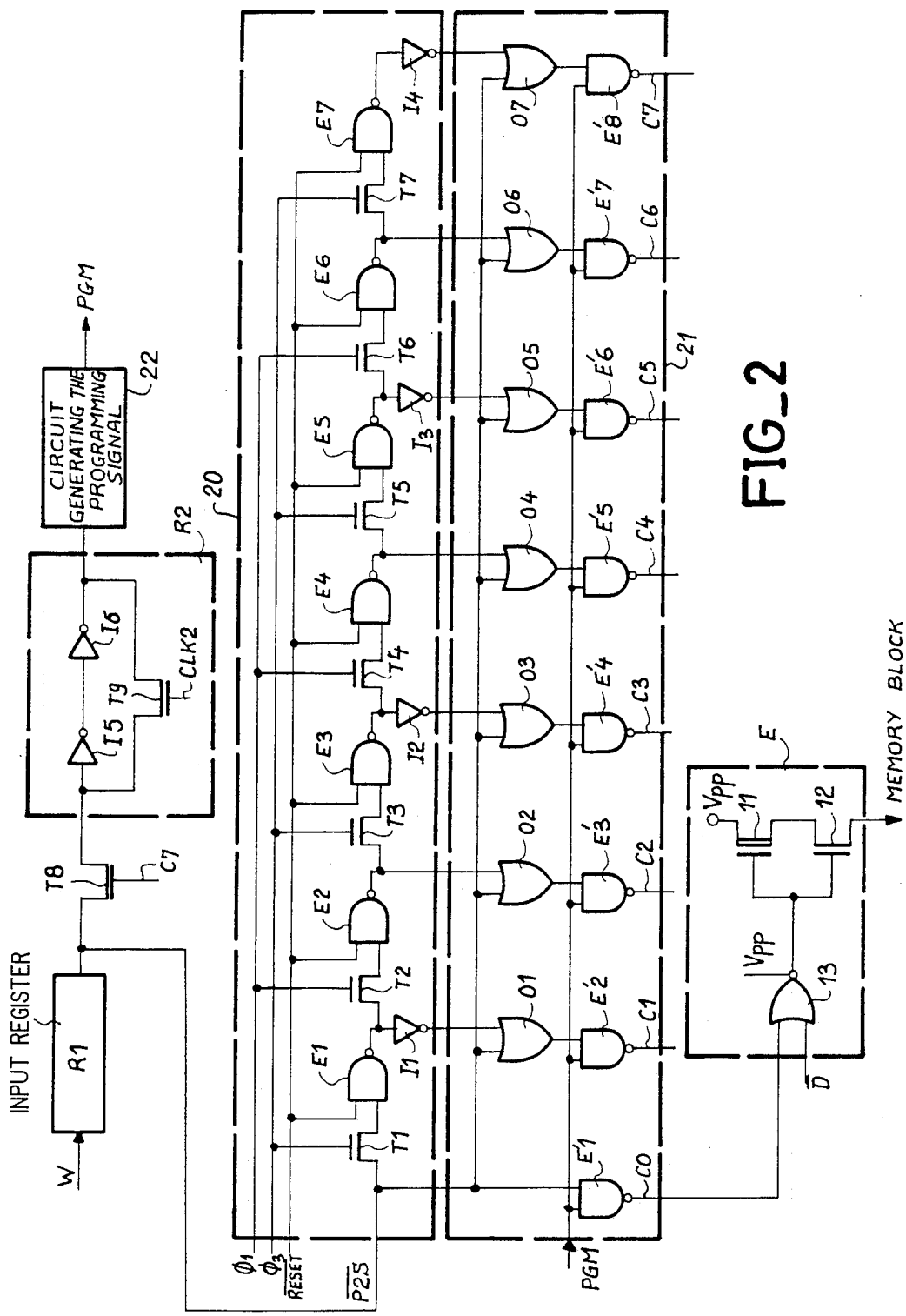
FIG_2

FIG_4
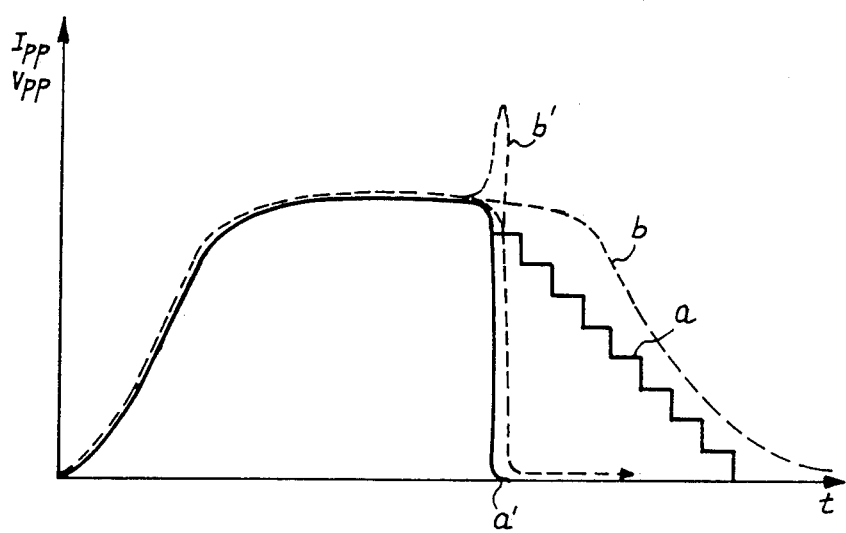

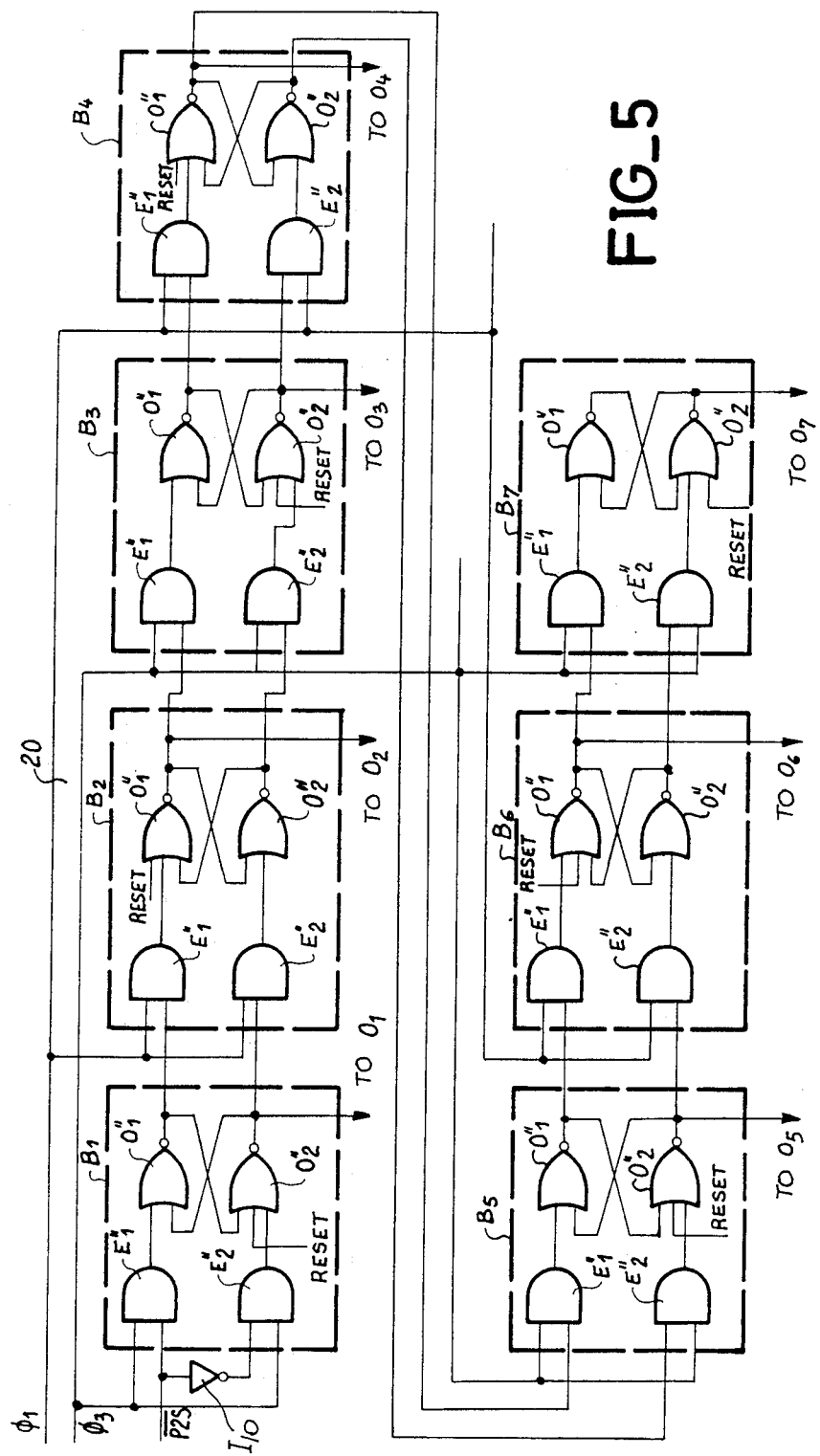
FIG_5

ELECTRICALLY PROGRAMMABLE NON-VOLATILE MEMORY HAVING SEQUENTIALLY DEACTIVATED WRITE CIRCUITS

BACKGROUND OF THE INVENTION

1. Field of the Invention

The present invention pertains to electrically programmable non-volatile memories. It pertains, more especially, to electrically programmable non-volatile memories such as, for example, EPROM or EEPROM memories which set up a surge in the programming voltage.

Generally, in memories of the EPROM or EEPROM type, each data storage element or memory cell consists of a floating gate MOS transistor. A floating-gate MOS transistor may have two states. For an N-channel MOS transistor, in a first state, no charge is trapped at the floating gate. There may be a conduction channel between the source and the drain. The transistor is then conductive and behaves like a closed switch. In a second state, electrons have been trapped at the floating gate. They prevent the creation of a conduction channel in the substrate between the source and the drain. In this case, the transistor is off and behaves like an open switch. To program a floating-gate MOS transistor of the type described above, voltages higher than the normal operating voltage should be applied to the control gate and one of the electrodes in such a way that the floating gate can absorb and retain a charge of electrons. Furthermore, to read a memory thus programmed, a specific read voltage must be applied to the control gate. This read voltage is used to ascertain that the transistor is on or off.

In order to make it possible to apply the voltages needed to program or read a memory cell, consisting of a floating-gate MOS transistor, the said floating-gate MOS transistor is generally connected in the way shown in FIG. 1. Thus, one of the main electrodes of the floating-gate MOS transistor 1, namely the source 2 in the embodiment shown, is connected to the voltage $V_{SS}$, representing the ground, while the other electrode or drain 3 is connected by a bit line (not shown) and a MOS transistor forming a switch 8 to a column address decoder 7. The control gate 5 of the MOS transistor 1 is connected by another connection, known as a word line (not shown) to a line address decoder 6. The bit lines and the word lines ae arranged in rows and columns to determine a matrix including the memory, cell formed by the floating-gate MOS transistor 1 known to one of ordinary skill in the art. In fact, the column address decoder 7 is connected to the gate of the transistor 8, which has its source connected to the drain 3 of the transistor 1 while its drain is connected to the write circuit E and to a read circuit, symbolized by the block L, respectively.

The write circuit E is made so that the programming voltage, namely the voltage $V_{PP}$ is applied at the node N when the memory cell 1 has to be programmed, i.e. when it has to record a datum corresponding to "1". On the contrary, if the memory cell 1 does not have to be programmed, the voltage at the node N during the write operation should remain at "0". As shown in FIG. 1, the write circuit is generally formed by a load line comprising a depleted MOS transistor 11, with one of its electrodes connected to the voltage $V_{PP}$ which constitutes the programming voltage, and its other electrode connected to one of the electrodes of an enhancement type MOS transistor 12. The other electrode of the transistor 12 is connected to the node N. The two gates of the transistors 11 and 12 are connected in common to a programming control circuit consisting of a NOR gate 13 powered by the voltage $V_{PP}$. This NOR gate 13 receives, respectively, at its two inputs a signal $\overline{D}$ corresponding to the reversed datum to be programmed and a signal $\overline{PGM}$ corresponding to the reversed programming control signal. Consequently, with the above circuit, when the floating-gate MOS transistor 1 is programmed at the logic level "1", a current variation is observed in the supply of the programming voltage $V_{PP}$.

In applications using electrically programmable non-volatile memories of the type described above, the memory cells are rarely programmed one by one. In fact, they are most often programmed in the form of a word, i.e. 8 memory cells for example, are programmed in parallel for a word with 8 binary positions or bits. Consequently, a current surge corresponding to 8 memory cells is observed in the supply of the programming voltage $V_{PP}$. Now the current surge in the supply of a programming voltage $V_{PP}$ for a memory cell is generally about 1 to 2 milliamperes. Consequently, when all 8 memory cells are programmed at "1" for example, the current surge in the supply of the programming voltage $V_{PP}$ can rise up to a value ranging between 8 milliamperes and 16 milliamperes. Now, when there is a change from the programming or write mode to the read mode, the write circuits are de-activated on all 8 memory cells at the same time. This causes a sudden drop in consumption since the programming current $I_{pp}$ then goes from 16 milliamperes to 0 milliamperes. This variation in the programming current $I_{PP}$ may then cause a voltage peak in the supply of the programming voltage $V_{PP}$. This peak can reach a value $\Delta V_{PP}$ of 7 volts. Now, this peak is very dangerous for all the circuits. For the transistors included in the circuits are designed to hold a maximum voltage defined by the technology used. This maximum voltage is 25 volts for 4-micron technology and 16 volts for 2-micron technology. There is therefore the danger that the variations in the programming voltage $V_{pp}$, which in fact is the highest voltage of the circuit, will destroy the circuit if the safeguards planned are exceeded and will consequently make the circuit unusable.

2. Brief Summary of the Present Invention

An object of the present invention is, therefore, to remove these disadvantages.

Consequently, an object of the present invention is an electrically programmable non-volatile memory comprising a matrix of memory cells accessible by rows and columns, with write and read circuits that apply potentials, representing the programmed datum or representing the read command, to the rows and columns, and means that handle the interconnection of the write and read circuits with the memory cells, a memory wherein N memory cells are programmed simultaneously (with N greater than 1) each memory cell making a current surge when it is programmed at "1", a memory further comprising first means to deactivate, one by one, the read circuits corresponding to the N memory cells during a change-over from a programming mode to a read mode, and second means to short-circuit the first means at the change-over to the programming mode.

According to a preferred embodiment, the first means comprise a shift register with one input, receiving the read/write control signal, and with N-1 outputs, the input and the N-1 outputs being respectively sent to N write circuits, the shift register being controlled by clock signals which switch over the outputs one by one. Furthermore, the second means to short-circuit the first means at the change-over to the programming mode comprise a combinative logic circuit activated by the read/write control signal and by the programming control signal generated at the end of the read operation, the combinative logic circuit being connected between the shift register and the write circuit s. The programming control signal is generated with the read/write control signal by means of a signal-separating circuit activated by the control signal of the Nth write circuit. Furthermore, the shift circuit receives a level resetting signal when it is turned on.

BRIEF DESCRIPTION OF THE DRAWINGS

Other characteristics and advantages of the present invention will appear from the following description of an embodiment made with reference to the appended drawings, of which:

FIG. 1, already described, is a schematic diagram of a memory cell of an EPROM memory connected to write and read circuits which are liable to receive the circuits of the present invention:

FIG. 2 represents an embodiment of circuits according to the present invention, designed to be connected between the input-register and the write circuit;

FIG. 3 represents a timing diagram of the main signals that control or leave circuits according to the present invention, FIG. 4 represents the curves $I_{PP}$ and $V_{PP}$ as a function of time in the case of a memory of the prior art and that of a memory fitted with circuits according to the present invention, and FIG. 5 represents another embodiment of a shift register which can be used in the present invention.

DESCRIPTION OF THE PREFERRED EMBODIMENTS

To simplify the description, the same elements have the same references in the drawings. Furthermore, the description has been done with reference to MOS circuits made with NMOS technology as well as to a memory of the EPROM type having memory cells consisting of floating-gate MOS transistors of the SAMOS (stacked gate avalanche, injection MOS). However, it should be clear to one of ordinary skill in the art that the present invention can be adapted to other technologies and to other types of memories.

According to the present invention, between the input register R1, used to obtain the programming control signal PGM and the write and read control signal $\overline{P2S}$ and the N write circuits used to program the N memory cells in parallel, there are means to deactivate, one by one, the read circuits corresonding to N memory cells during a change-over from a programming mode into a read mode, and there are second means to short-circuit the first means during a change-over to the programming mode.

As shown in FIG. 1, which pertains to the programming of 8 memory cells in parallel, the first means used to de-activate, one by one, the read circuits corresponding to N memory cells during a change from a programming mode to a read mode, essentially comprises a shift register 20. The second means, used to short-circuit the first means when changing over to the programming mode, essentially comprise a combinative logic circuit 21 associated with a signal separator R2 put into operation by a switch which is controlled by the Nth output of the circuit 21.

More specifically, the shift register 20 comprises N−1 NAND gates, namely 7 NAND gates E1 to E7 in the embodiment shown. The said NAND gates are series-connected by means of 7 MOS transistors T1 to T7 mounted as a switch. Thus one of the main electrodes of each of the MOS transistors T1 to T7 is connected to one of the inputs of each NAND gate E1 to E7. Its other main electrode is connected to the output of the preceding NAND gate, the first MOS transistor T1 receiving, at its other electrode, the read/write control signal $\overline{P2S}$ coming from the register R1. Furthermore, the gates of the various transistors T1 to T7 are connected to clock signals $\phi_1$ or $\phi_3$ which switch the outputs over one by one. In fact, the signals $\phi_1$ and $\phi_3$ are sequencing signals obtained from the clock signal of that memory which has the special feature of having pulses that are phase-shifted with respect to one another so that they are never simultaneously at the logic level "1". Thus, as shown in FIG. 2, the gates of the odd-numbered switch MOS transistors, namely the transistors, T1, T3, T5 and T7, are controlled by the signal $\phi_3$ while the gates of the even-numbered switch MOS transistors, T2, T4 and T6, are controlled by the signal $\phi_1$. Furthermore, the other input of each of the NAND gates E1 to E7 receives a level-resetting signal, more particularly a "1" reset signal, marked $\overline{RESET}$ in the figure. The outputs of the odd-numbered NAND gates E1, E3, E5 and E7 are connected to inverters I1, I2, I3 and I4. The outputs of the shift register 20 are therefore formed by the outputs of the inverters I1, I2, I3, and I4 and the outputs of the NAND gates E2, E4, E6 in the embodiment shown.

In accordance with the present invention, these outputs are sent to the input of the combinative logic circuit 21, used to short-circuit the shift register at the change-over to the programming mode. This circuit 21 essentially consists of OR gates, 01 to 07, and NAND gates, E'1 to E'8, respectively controlled by the outputs of the read/write control signal $\overline{P2S}$, the shift register 20 and the programming control signal PGM as shown in FIG. 2. More specifically, each output of the shift register 20 is sent to an input of an OR gate, 01 to 07, the other input of which receives the read/write control signal $\overline{P2S}$. The outputs of the OR gates, 01 to 07, are respectively sent to one of the inputs of each NAND gate, E'2 to E'8, the other input of which receives the programming control signal PGM. Furthermore, the NAND gate E'1 receives the programming control signal $\overline{P2S}$ at one of its inputs and the signal PGM at its other input. The outputs of the NAND gates, E'1 to E'8, give the eight "bit" control signals, $C^0$ to $C^7$, each of which controls one of the write circuits E replacing the signal $\overline{PGM}$ in the embodiment of FIG. 1. Thus, as shown in FIG. 2, the signal $C^0$ is sent to an input of the NOR gate 13, supplied with $V_{PP}$. The said NOR gate 13 receives the datum to be programmed at its other input, in inverted form, namely the signal $\overline{D}$. The output of this NOR gate 13 is connected to the two MOS transistor gates 11 and 12, forming the load line of a memory cell (not shown). To simplify the description, only one write circuit E, connected to the control $C^0$, has been shown. However, it will be obvious to one of ordinary skill in the art that the controls $C^1$ to $C^7$ are each connected to a write circuit similar to the one shown in FIG. 2.

Furthermore, as shown in FIG. 2, the signal $\overline{P2S}$ is obtained at the output of the register R1, which is well-known to those of ordinary skill in the art. This register R1 receives a read or write command at the input, represented by the signal W. The register R1 generally consists of a dynamic register. Furthermore, the signal from the register R1 is sent to a circuit 22 which generates a programming signal PGM by means of a signal separator R2. This signals separator R2 is put into operation by a switch comprising the MOS transistor T8. The gate of this MOS transistor T8 is connected to the bit control signal C7. The signal separator R2 also comprises a dynamic register of a known type, namely two inverters I5 and I6 normally preceded by storage capacitors (not shown) used to store data at the input. The output of the inverter I6 is looped back to the input of the inverter I5 by means of a MOS transistor T9 which has its gate connected to one of the clocks of the memory marked CLK2. The output of the circuit R2 is sent to the circuit 22 which generates the programming signal. This circuit 22 is well-known to those of ordinary skill in the art and will not be described again herein. At the output of the circuit 22, the programming control signal PGM is obtained. This programming signal PGM is used, in particular, to switch to either the programming voltage $V_{PP}$ or the power voltage VCC at the gate 5 of the floating-gate MOS transistor 1 (see FIG. 1), which constitutes a memory cell, depending on whether the register R1 input command is a write command or a read command.

With reference to FIG. 3, we shall now describe the functioning of the above circuit. Thus, when the write command W goes to the level "1", a read/write control signal $\overline{P2S}$ is obtained at the output of the register R1. The said signal $\overline{P2S}$ also goes to the level "1". Since the bit control signal C7, applied to the transistor gate T8, is at the logic level "1", the transistor T8 which forms a switch is on. Consequently, the signals separator R2 is in operation. It therefore controls the circuit 22 that generates the programming signal. At the output of this circuit, a signal PGM is obtained and is set up at level "1" with a certain delay. When the signal PGM goes to the level "1", the programming voltage $V_{PP}$ is set up throughout the memory. Since the programming control signal PGM and the read/write control signal $\overline{P2S}$ are both at the level 1, the outputs C0 to C7 of the NAND gates E'1 to E'8 go to the logic level "0": this is the level at which they are active in order to control the various write circuits E as explained above with reference to FIG. 1. The read/write control signal $\overline{P2S}$ is applied to the NAND gates E1 to E8. It is applied directly for the NAND gate E'1 or through the OR gates 01 to 07. The output of one of the said OR gates 01 to 07, applied at the input of an associated NAND gate E'2 to E'8, is at the logic level "1" as soon as one of the inputs is at the logic level "1". In this case, the operation of the shift register 20 is inactive at the outputs C0 to C7. When the control C7 moves to the logic level "0", the transistor T8 goes off and separates the register R1 from the register R2. However, the register R2 refreshes the input datum, thus making it possible to maintain the programming signal PGM at the logic level "1".

When the write command W goes to the logic level "0", i.e. during the change-over from a programming mode to a read mode, the output signal of the register R1, namely the read/write control signal $\overline{P2S}$ goes to the logic level "0". At this moment, the output C0 of the NAND gate E'1 goes to the logic level "1" thus turning off the write circuit E and causing a current surge in the supply voltage $V_{PP}$ corresponding to a write circuit. Furthermore, one of the inputs of the OR gates 01 to 07 is thus at the zero level while the other inputs formed by the inputs of the register 20 are still at the logic level "1". Consequently, the outputs of the OR gates 01 to 07 are at the logic level "1" and the outputs C1 to C7 of the NAND gates E'2 to E'8 remain at the logic level "1", so that the corresponding write circuits are not turned off. When $\phi_3$ goes to the logic level "1", i.e. when a $\phi_3$ pulse is present at the gate of the transistor T1, this gate comes on and puts one of the inputs of the NAND gate E1 at the logic level "0". Since the other input of the NAND gate E1 is at the logic level "1", the output of this NAND gate E1 goes to the logic level "1", thus causing a logic level "0" at the output of the inverter I1. Since the OR gate O1 receives two logic levels "0" at its input, its output goes to the logic level "0" and the output C1 of the NAND gate E'2 goes to the logic level "1", causing the corresponding write circuit to go off. Similarly, when $\phi_1$ goes to the logic level "1", the transistor T2 comes on. The corresponding input of the NAND gate E2 goes to the logic level "1" and the output of this NAND gate E2 goes to the logic level "0". Thus, since both inputs of the OR gate 02 are at the logic level "0", the output of this OR gate goes to the logic level "1". This causes the output C2 of the NAND gate E'3 to go to the logic level "1". When $\phi_3$ goes to the logic level "1", the transistor T3 comes on, making the information at the output of the gate E2 go to the input of the gate E3. This makes the command C3 go to the logic level "1" in a manner identical to the change in the command C1. When $\phi_1$ goes back to the logic level "1", the transistor T4 goes off, and the process continues in this way for the transistors T5 to T7 which work identically to the transistors T1 to T4.

With the circuit described above, a step-by-step reduction is obtained in the programming current $I_{PP}$ as a function of the time t, as shown in the curve a in FIG. 4, instead of an instantaneous passage to zero as shown in the curve a'. As a result, the voltage $V_{PP}$ decreases gradually as shown in the curve b of FIG. 4, instead of displaying the voltage peak shown in the curve b'. This prevents damage to the circuits of the memory.

It will be clear to those of ordinary skill in the art that other types of shift registers 20 and combinational logic circuits 21 can be used in the present invention.

Thus, as shown in FIG. 5, the shift register 20 can be made with master/slave flip-flops B1 to B7.

More specifically, the flip-flop B1 has two AND gates E"1 and E"2, respectively connected to two NOR gates O"1 and O"2. Thus the AND gate E"1 receives the input signals $\overline{P2S}$ and the signal $\phi_3$ respectively, while the AND gate E"2 receives the signal $\overline{P2S}$ inverted by the inverter I10, and the signal $\phi_3$. The outputs of the AND gates E"1 and E"2 are respectively sent to one input each of the NOR gates O"1 and O"2. The other input of the NOR gate O"1 is connected to the output of the NOR gate O"2, while the other input of the NOR gate O"2 is connected to the output of the NOR gate O"1. Furthermore, the NOR gate O"2 receives a zero reset signal, Reset. The outputs of the NOR gates O"1 and O"2 are connected to the inputs of the flip-flop B2, i.e. one of the inputs of the OR gate 01 of the combinational logic circuit 21 is connected to one of the inputs of the AND gate E"1 or E"2, respectively of the said flip-flop B2 and the output of the NOR gate 0"2. The structure of the flip-flop B2 is identical to that of the flip-flop B1. However, the other inputs of the AND gates E"1 and E"2 receive the clock signal $\phi_1$. Furthermore, the zero reset signal, Reset, is sent to the NOR gate 0"1 and the output of this NOR gate 0"1 is connected to one of the inputs of the OR gate 02 of the circuit 21. Furthermore, the flip-flops B3, B5 and B7 receive the same signals as the flip-flop B1 while the flip-flops B4 and B6 receive the same signals as the flip-flop B2.

The operating mode of this shift register is identical to the one described for the shift register 20 of FIG. 2.

What is claimed is:

1. An electrically programmable non-volatile memory circuit comprising:
   a matrix of memory cells accessible by rows and columns,
   N write circuits for simultaneously writing a N bit word in the memory,
   an input for a read/write mode control signal, and means coupled to said input and said write circuits for activating the N write circuits in a write mode and deactivating said N write circuits in a read mode,
   said means for activating and deactivating the N write circuits comprising delay means for deactivating successively one by one of said N circuits when said read/write control signal changes from a write mode to a read mode, and inhibiting means for preventing action of the delay means on the said N circuits when said read/write control signal changes from a read mode to a write mode, so that said write circuits are activated simultaneously in response to said change from the read mode to the write mode.

2. A memory according to claim 1, wherein the delay means comprise a shift register having an input for receiving the read/write control signal and with N-1 outputs, the said input and N-1 outputs of the shift register being adapted to each supply respective deactivation signal to a respective one of said n write for successive deactivation thereof.

3. A memory according to claim 2 wherein said shift register comprises a reset input, said reset input being adapted to reset to an initial logical state each of the N-1 outputs of the register, upon powering of the memory.

4. A memory according to claim 2, wherein said shift register comprises N-1 serially connected flip-flops of the master-slave type, the flip-flops of odd rank being controlled by a first clock signal and the flip-flops of even rank being controlled by a second clock signal, said first and second signals non-overlapping, the N-1 outputs of the shift register being connected each to an output of a respective flip-flop.

5. A memory according to claim 2, wherein said inhibiting means comprise a logic circuit, said logic circuit having a first input for receiving said read/write control signal, and a second input for receiving a programming signal (PGM), and N outputs each connected to a respective write circuit for activation or deactivation thereof, said logic circuit being adapted for receiving the N-1 outputs of the shift register, the Nth output, corresponding to the last write circuit to be deactivated, being connected to a circuit for generating said programming signal so as to firstly inhibit the programming signal immediately after the Nth circuit has been deactivated and secondly authorize a later production of another programming signal.

6. A memory according to claim 2, wherein said shift register comprises N-1 serially connected elementary circuits, each comprising a transistor and a gate, each gate having at least a first input and an output, said first input of the gate of all but the first elementary circuit being connected through the corresponding transistor of the same elementary circuit to the output of the gate of an immediately preceding elementary circuit, the transistors of the elementary circuits of even rank in the serial arrangement being controlled by a first clock signal, and the transistors of the elementary circuit of uneven rank being controlled by a second clock signal, said first and second signal being non-overlapping, the N-1 outputs of the shift register being connected directly or through an inverter each to a respective output of the N-1 gates.

7. A memory according to claim 6, wherein each of said gates is a NAND gate and has a second input, said second input connected to a common reset input.

* * * * *